United States Patent

Nguyen et al.

[11] Patent Number: 6,097,619
[45] Date of Patent: Aug. 1, 2000

[54] SYMMETRIC MEMORY BOARD

[75] Inventors: Kevin Nguyen, Beaverton, Oreg.; Binh Quang Nguyen, Houston; Siamak Tavallaei, Spring, both of Tex.

[73] Assignee: Compaq Computer Corp., Houston, Tex.

[21] Appl. No.: 09/100,919

[22] Filed: Jun. 19, 1998

[51] Int. Cl.$^7$ .................................................. G11C 5/06
[52] U.S. Cl. .................................................. 365/63; 365/52
[58] Field of Search ........................... 365/63, 191, 52, 365/49; 257/579

[56] References Cited

U.S. PATENT DOCUMENTS

| | | | |
|---|---|---|---|
| 5,260,892 | 11/1993 | Testa | 365/63 |
| 5,821,614 | 10/1998 | Hashimoto et al. | 275/679 |
| 6,023,148 | 2/2000 | Pignolet | 320/119 |

Primary Examiner—David Nelms
Assistant Examiner—Thong Le
Attorney, Agent, or Firm—Williams, Amerson & Morgan

[57] ABSTRACT

A memory storage system includes a motherboard, a first memory card, and second memory card. The motherboard has a first and second electrical connector. The first memory card has a plurality of electrical connections coupled to the first electrical connector on the motherboard. The first memory card is adapted to receive a plurality of data signals over the first electrical connector and store the data signals in a first preselected pattern. A second memory card has a plurality of electrical connections coupled to the second electrical connector on the motherboard. The second memory card is adapted to receive a plurality of data signals over the second electrical connector and store the data signals in a second preselected pattern, different from the first preselected pattern.

12 Claims, 9 Drawing Sheets

SYMMETRIC MEMORY BOARD

BACKGROUND OF THE INVENTION

1. Field of the Invention

This invention relates generally to a method and apparatus for configuring printed circuit boards, and, more particularly, to a method and apparatus for configuring a semiconductor memory board.

2. Description of the Related Art

In the field of electronics, it is efficient and cost-effective to design products that have a long useful life, and do not become obsolete too soon. One method for extending the life of electronic products is to provide for upgrades. That is, replacing components with newer, more powerful components may extend the useful life of an electronic product. This upgradeability, however, creates limitations regarding the form of the upgradeable component. That is, the upgraded component must fit within the physical space provided for the original component.

Computer systems are typically configured with a motherboard, which is designed to house a particular type of microprocessor, and a plurality of add-on boards connected thereto via edge connectors. These add-on boards provide a number of subsidiary functions, such as video controllers, audio controllers, memory boards, etc. Often, it is useful to replace the microprocessor and the motherboard to upgrade the computer system. When the motherboard is replaced, it is desirable that the add-on boards may still be used with the new motherboard. Moreover, as computer systems are upgraded, they typically realize enhanced performance, increasing the need for some add-on functions, such as more memory. Add-on memory cards, however, can be large and, thus, difficult to locate within the available space on the motherboard, especially since the space and geometries originally provided were for a less powerful system, with less need for memory. That is, the original design of the computer system may not have anticipated the need for additional memory boards.

Further, the increasing complexity of computer systems has also resulted in more add-on boards being packed into the same or smaller space. Thus, less and less room is available for the add-on boards, which necessitates that the boards be closely proximate one another. This close positioning of the add-on boards further reduces the available envelope for the relatively large memory boards.

The present invention is directed to overcoming, or at least reducing the effects of, one or more of the problems set forth above.

SUMMARY OF THE INVENTION

In one aspect of the present invention, a memory storage system is provided. The memory storage system includes a motherboard, which has first and second electrical connectors. A first memory card has a plurality of electrical connections coupled to the first electrical connector on the motherboard. The first memory card is adapted to receive a plurality of data signals over the first electrical connector and store the data signals in a first preselected pattern. A second memory card has a plurality of electrical connections coupled to the second electrical connector on the motherboard. The second memory card is adapted to receive a plurality of data signals over the second electrical connector and store the data signals in a second preselected pattern, different from the first preselected pattern.

In another aspect of the present invention, a motherboard is provided. The motherboard includes a first plurality of electrical traces adapted to receive data signals thereon, a second plurality of electrical traces adapted to receive address signals thereon, and a first and second electrical connector. The first electrical connector is coupled to the first and second plurality of traces in a symmetric pattern and is adapted to receive a memory board in a first orientation. The second electrical connector is coupled to the first and second plurality of traces in the symmetric pattern and is adapted to receive a memory board in a second orientation. The second plurality of traces are coupled to the second electrical connector in reverse order.

BRIEF DESCRIPTION OF THE DRAWINGS

The invention may be understood by reference to the following description taken in conjunction with the accompanying drawings, in which like reference numerals identify like elements, and in which.

Figure 1:
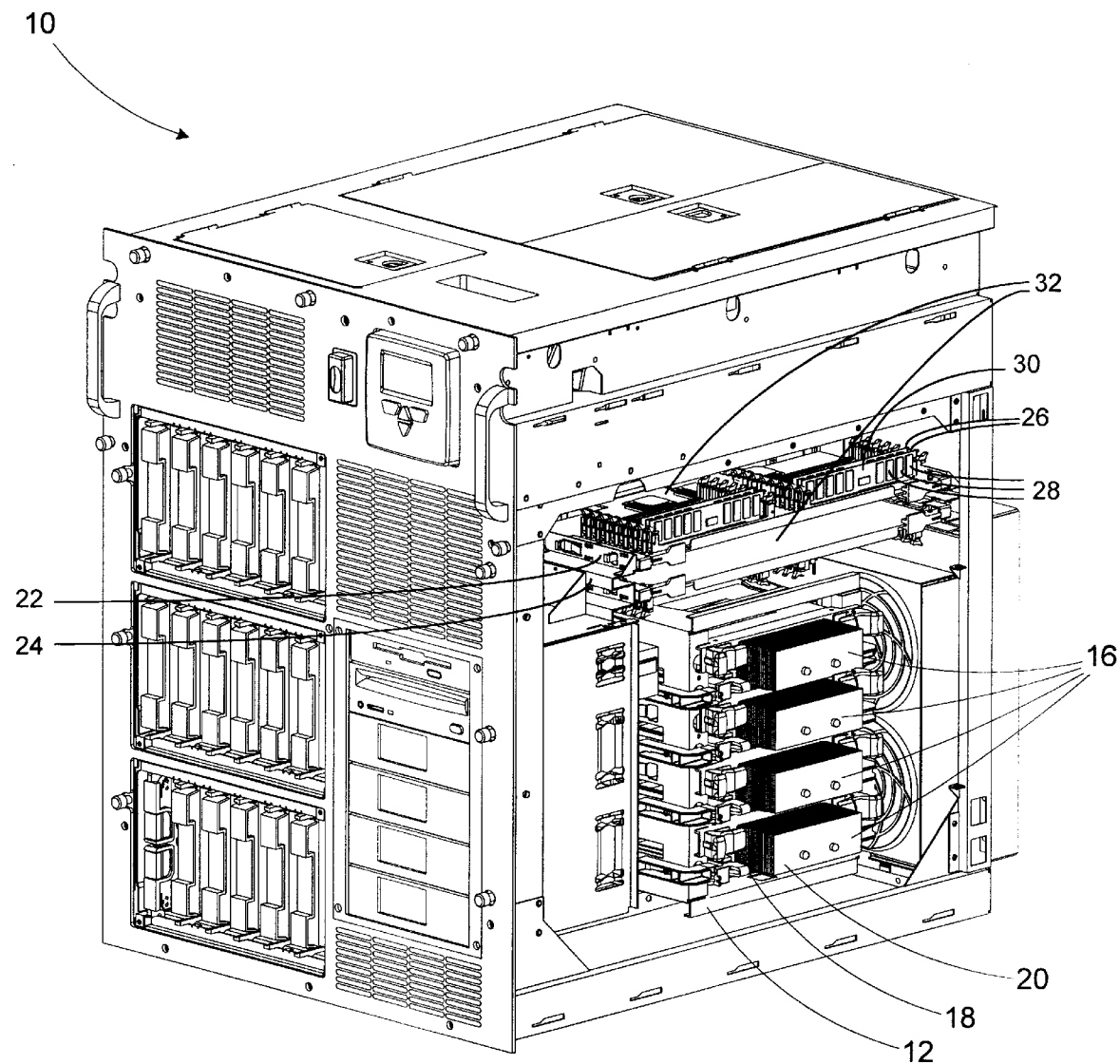
FIG. 1 illustrates a perspective of a personal computer, such as a server.

While the invention is susceptible to various modifications and alternative forms, specific embodiments have been shown by way of example in the drawings and are described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and in particular, to FIG. 1, a perspective view of a personal computer, such as a server 10 is shown. The server 10 has a side access panel (not shown) removed, exposing a microprocessor cage 12 mounted to a motherboard (not shown). The microprocessor cage 12 houses a plurality of printed circuit boards 16. In the embodiment of the server 10 illustrated in FIG. 1, the printed circuit boards 16 are of two general types, a microprocessor printed circuit board 18 and a voltage regulator module 20. Adjacent and above the microprocessor cage 12 are a pair of memory boards 22, 24. The microprocessor cage 12, its printed circuit boards 16, and the memory boards 22, 24 are all orthogonally mounted to a vertically disposed motherboard (not shown). Each of the boards 16, 22, 24 are electrically coupled to the motherboard (not shown) via conventional edge connectors (not shown) mounted directly on the motherboard (not shown).

The memory boards 22, 24 are populated by a plurality of conventional SIMMs (single-sided in-line memory modules) and/or DIMMs (dual-sided in-line memory modules) 26, which are hereafter referred to collectively as DIMMs 26 for purposes of convenience. Each of the DIMMs 26 has a plurality of semiconductor memory devices, such as DRAMs (dynamic random access memory) 28 surface mounted on a relatively small rectangular printed circuit board 30. The rectangular printed circuit board 30 is inserted on-edge in an edge connector 32 coupled directly to the memory board 22, 24. Thus, the DIMMs 26 extend outwardly from a surface of the memory board 22, 24 by a distance approximately equal to that of the height dimension of the rectangular printed circuit board 30. A conventional DIMM 26 measures in the range of approximately 0.75 to 1.65 inches in height. The DIMMs 26 are mounted to only a front surface 32 of the memory board 22, 24, and, thus, extend outwardly from the memory board 22, 24 on only a single side.

In the illustrated embodiment, the DIMMs 26 extend outwardly from the memory boards 22, 24 in opposite directions. That is, the memory boards 22, 24 are mounted on the motherboard in a back-to-back arrangement. Since the boards 22, 24 are substantially identical, and may be substituted for one another, one of the memory boards 22, 24 is mounted backwards, such that its electrical connections on its edge connector (not shown) are reversed. The form factor, or physical dimensions, of the motherboard prevents the edge connectors thereon from being physically separated by a sufficient distance to receive the memory boards 22, 24 in the same orientation. For example, the memory board 22 cannot have its orientation reversed so that it properly aligns with like electrical connections on the memory board 24.

Unlike conventional memory boards, the memory boards 22, 24 are mounted in the server 10 back-to-back. That is, the front surfaces 32 of the memory boards 22, 24 face away from each other, resulting in the DIMMs 26 extending in opposite directions. In other words, the memory board 22 is installed backward in its edge connector in the motherboard relative to the memory board 24. However, in the embodiment of the invention illustrated herein, the memory boards 22, 24 are relatively identical, and can be installed in either position without affecting the operation of the server 10.

Figure 2B:
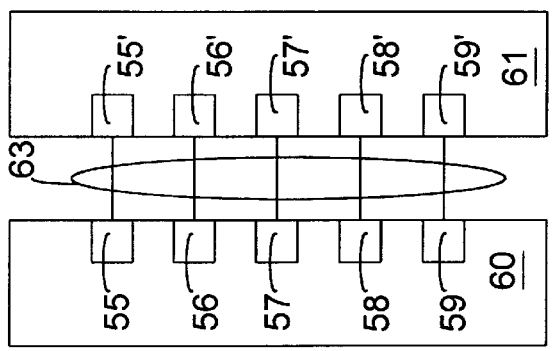
FIGS. 2A–C illustrate stylized drawings of various embodiments of electrical connections on a motherboard of the server of FIG. 1.
Figure 2C:
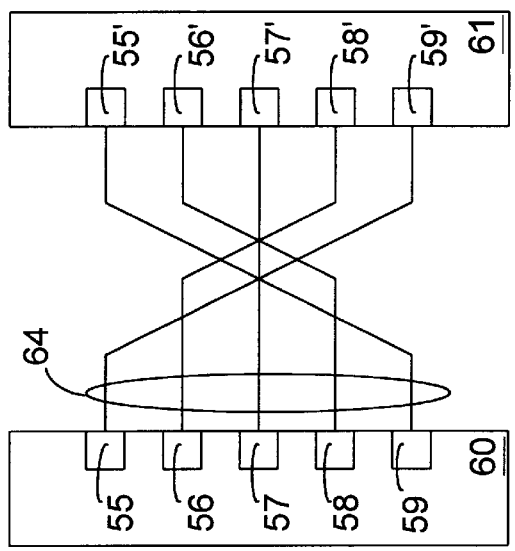
Figure 2A:
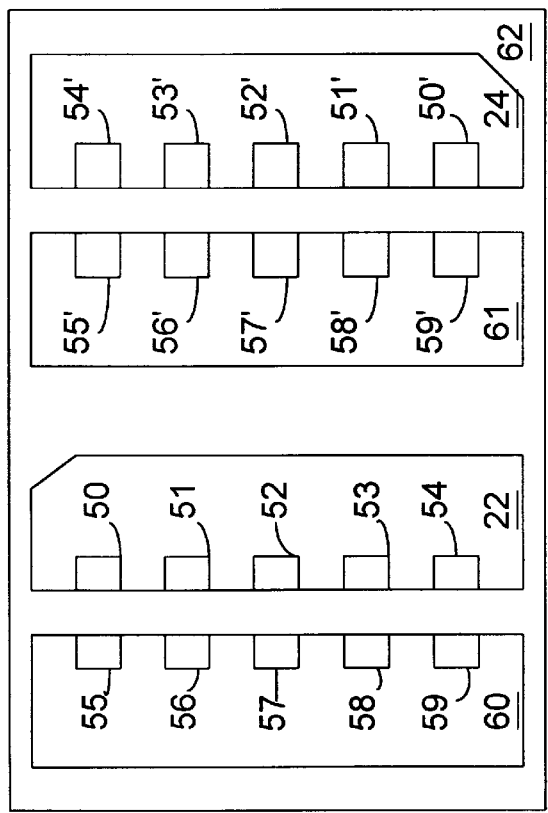

FIG. 2A illustrates an exemplary schematic drawing of electrical connections of a simplified embodiment of the memory boards 22, 24. That is, the memory board 22 is shown with connections 50–54 coupled to connections 55–59, respectively, of an edge connector 60 mounted on the motherboard 62. Similarly, the memory board 24 is shown with its connections 50'–54' coupled to the connections 59'–55', respectively, of an edge connector 61 mounted on the motherboard 62.

In a motherboard that does not require, or allow, adjacent memory boards to be installed backwards, the edge connectors 60, 61 may have relatively straightforward interconnections. In one exemplary embodiment shown in FIG. 2B, the edge connectors 60, 61 have electrical connections 55–59 and 55'–59', respectively, that align with one another. Thus, a plurality of traces 63 extend linearly between the edge connectors 60, 61. The linear arrangement of traces 63 is simple, allowing all of the traces 63 to be of like length, which causes electrical signals delivered over the traces 63 to experience minimal and like transmission delays.

One method that would account for the reversed connections relative to the memory boards 22, 24 would involve electrically coupling the connections 55–59 of the edge connector 60 with the connections 59'–55', respectively, of the edge connector 61, as illustrated in the electrical schematic of FIG. 2C. The interconnections may take the form of electrical traces 64 that have longer and more convoluted paths, and have paths that vary in length. The variations in length of the traces 64 may have a negligible effect where the number of connections 55–59 is relatively small, and where the size of the edge connectors 60, 61 are relatively short. In one embodiment, however, the electrical connectors 60, 61 measure about 5.76 inches long and have 302 electrical connections. Thus, timing problems may be induced by variations in signal transition times arising from the variations in the lengths of the traces 64.

Figure 3A:
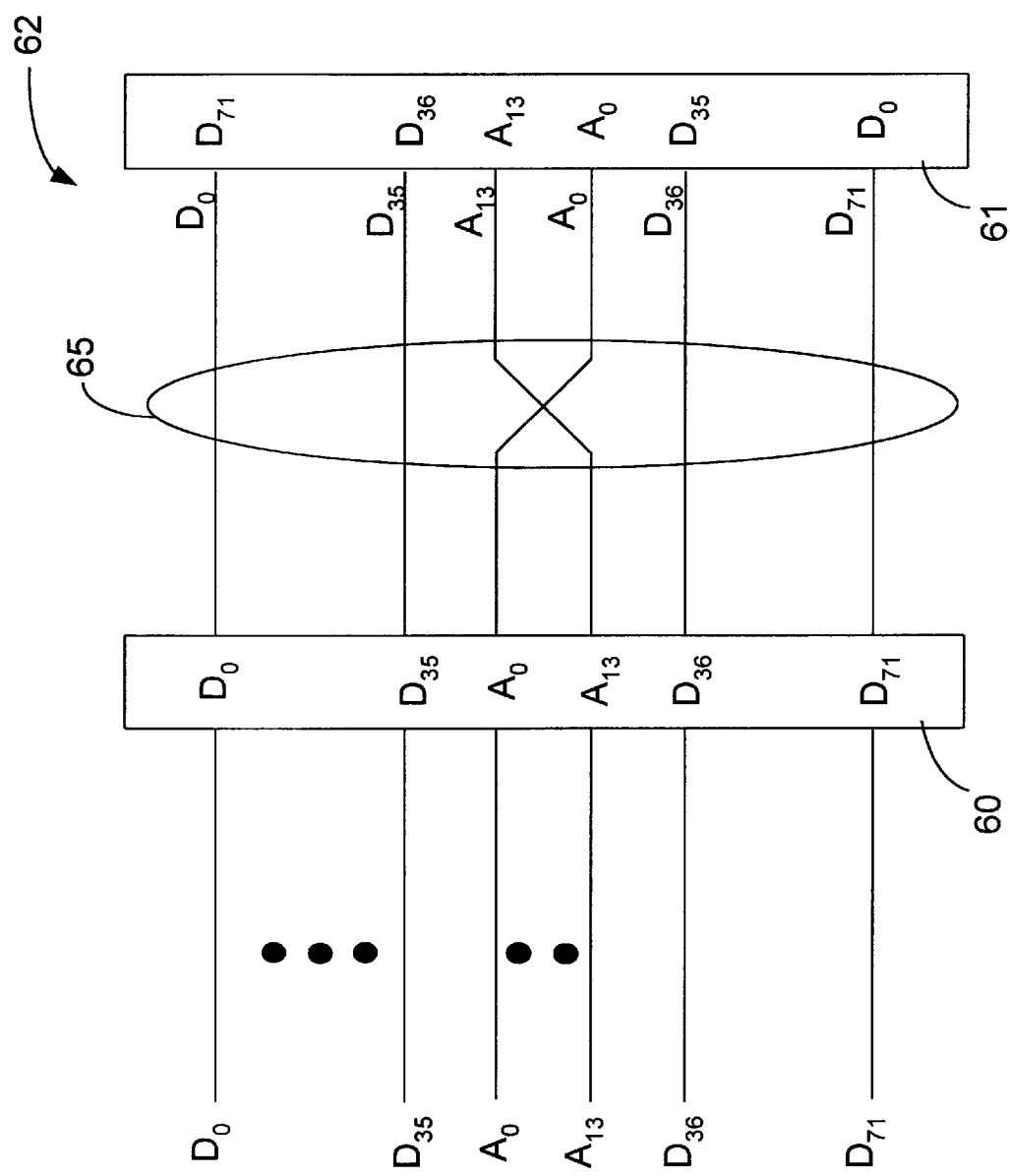
FIGS. 3A and 3B illustrate stylized drawings of embodiments of electrical connections between a pair of edge connectors of FIGS. 1 and 2A.

Referring now to FIG. 3A, one embodiment of an interconnection of traces 65 between the edge connectors 60, 61 is shown. In the embodiment illustrated in FIG. 3, the computer system routes 72 data lines and 14 address lines to the edge connectors 60, 61. The address lines A0–A13 are coupled to the center of the edge connector 61, aligning with the corresponding address lines A0–A13 of the memory board 22 installed in the edge connector 61. The address lines A0–A13 are cross-coupled between the edge connectors 60, 61 to align with the reversed installation of the memory card 24 in the edge connector 61. Similarly, the data lines D0–D71 are split into two groups disposed about the address lines A0–A13. The data lines D0–D71 align with the corresponding data lines D0–D71 of the memory board 22 installed in the edge connector 61. Unlike the address lines A0–A13, the data lines D0–D71 are not cross-coupled between the edge connectors 60, 61. Rather, the data lines D0–D71, owing to the reversed installation of the memory card 24 in the edge connector 61, align with the data lines D71–D0 of the memory card 24. That is, data delivered to the memory card 24 is reversed, but the address is not.

Accordingly, when data is written onto the memory card 22, it is stored conventionally. However, when data is written onto the memory card 24, it is stored at the proper address, owing to the reversed address traces 65, but the data is stored in reverse order, as compared with the storage order in the memory card 22. Storing the data in reverse order is not problematic because when the stored data is subsequently retrieved, it is placed on the data lines D0–D71 in the proper order automatically. In fact, the data may be stored in any order, as reading the data from the DIMMs 26 on the memory board 26 automatically reorders the data. It is sufficient that the data lines D0–D71 from the edge connector 60 are connected to the 72 data pins of the memory card 61 so that the data will be stored in the DIMMs 26.

Figure 3B:
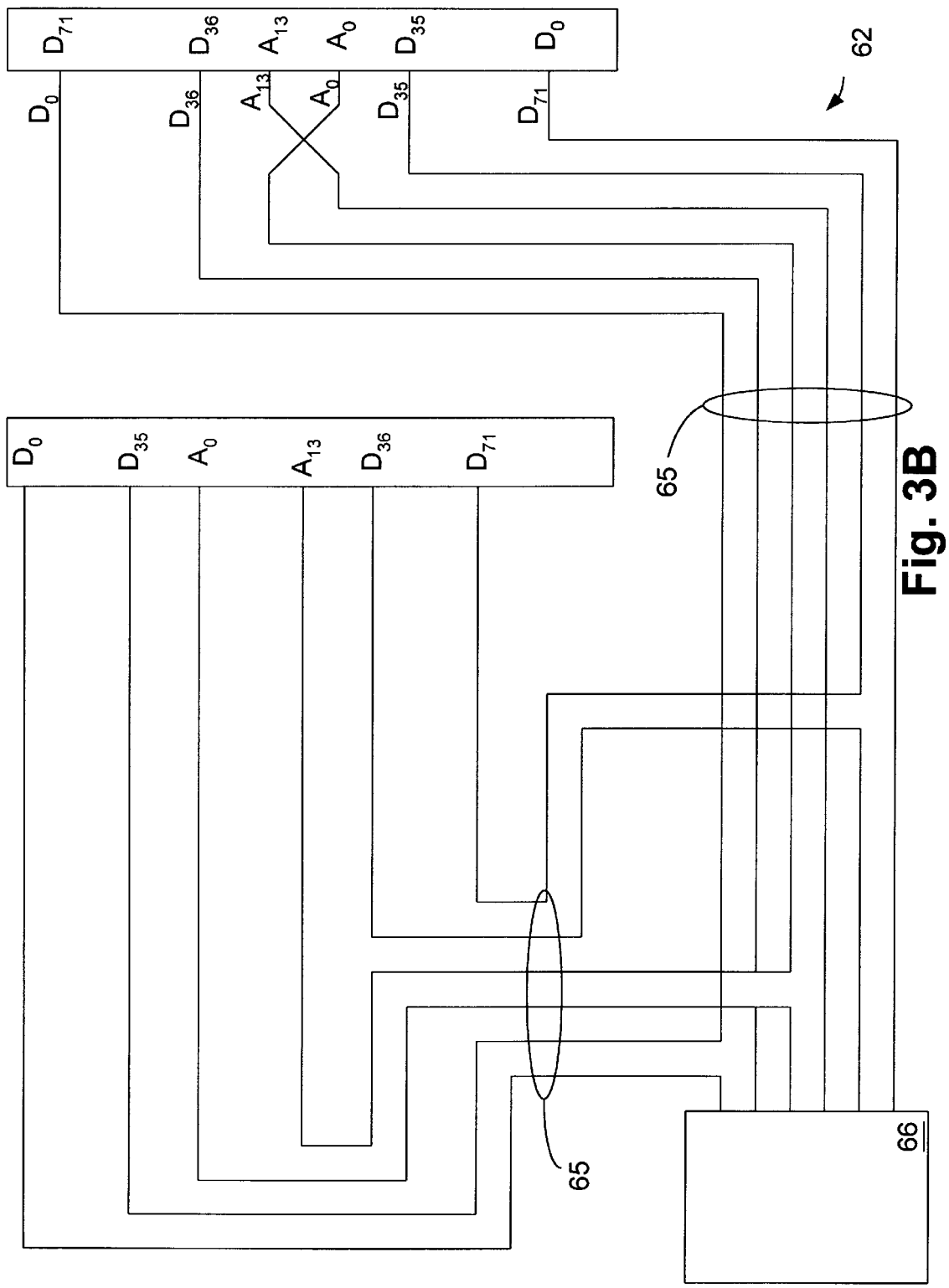

FIG. 3B illustrates an alternative embodiment of an interconnection of traces 65 between the edge connectors 60, 61. The connections of the data and address traces 65 are substantially identical to those illustrated in FIG. 3A. The main difference between FIGS. 3A and 3B relates to the routing of the traces 65. That is while the traces 65 are routed directly between the edge connectors 60, 61 in FIG. 3A, they are instead routed from a memory controller 66, in parallel with the traces routed to the edge connector 60. This parallel routing may be useful in some applications to maintain signal transit time substantially similar for signals delivered to connectors 60, 61. That is, by making the traces 65 of similar length, the transit time of like signals will be similar. For example, a signal placed on the data line D0 by the controller 66 will arrive at the connectors 60, 61 at substantially the same time, owing to the similar lengths of the traces 65.

Figure 4:
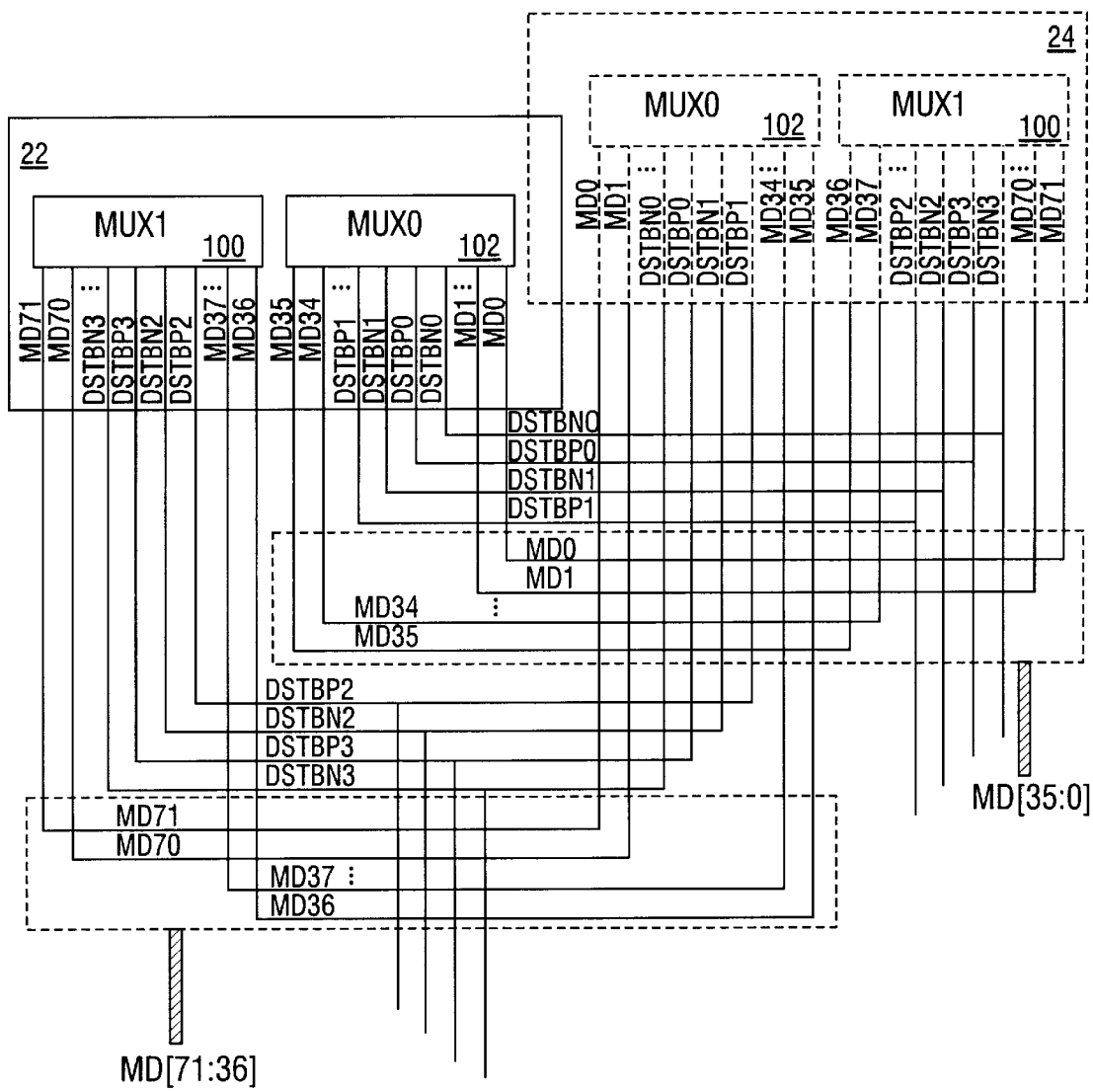
FIG. 4 illustrates one embodiment of an electrical schematic of connections between the memory cards of FIG. 1.
Figures 1, 5A:
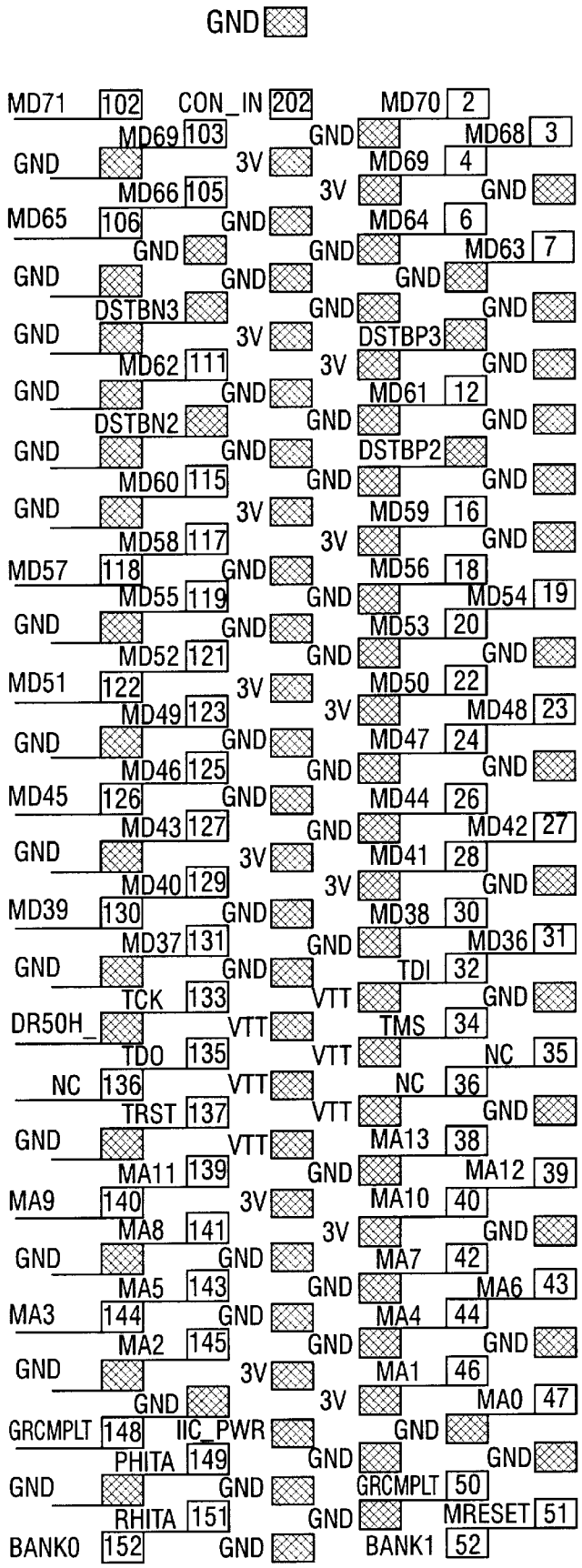
Figures 2, 5A:
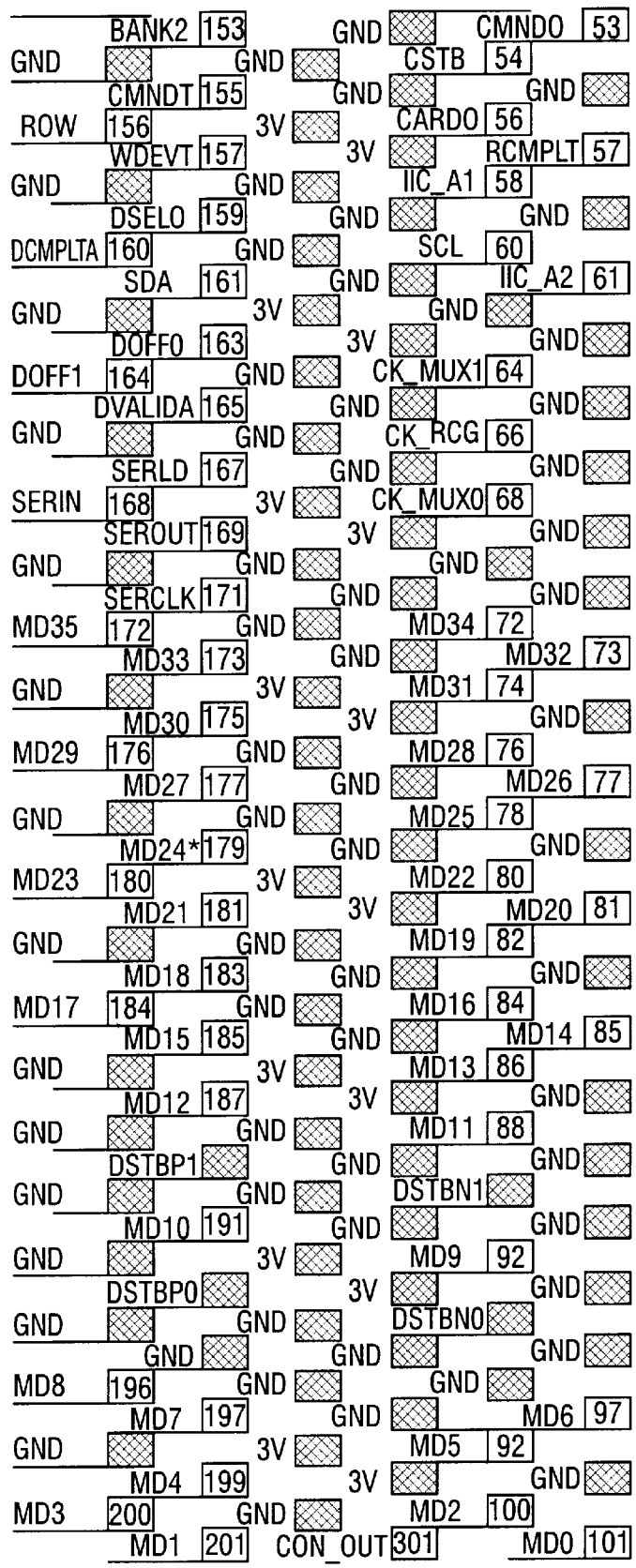
FIG. 5 illustrates one embodiment of pin assignments of the edge connectors of FIGS. 1 and 3.
Figures 1, 5B:
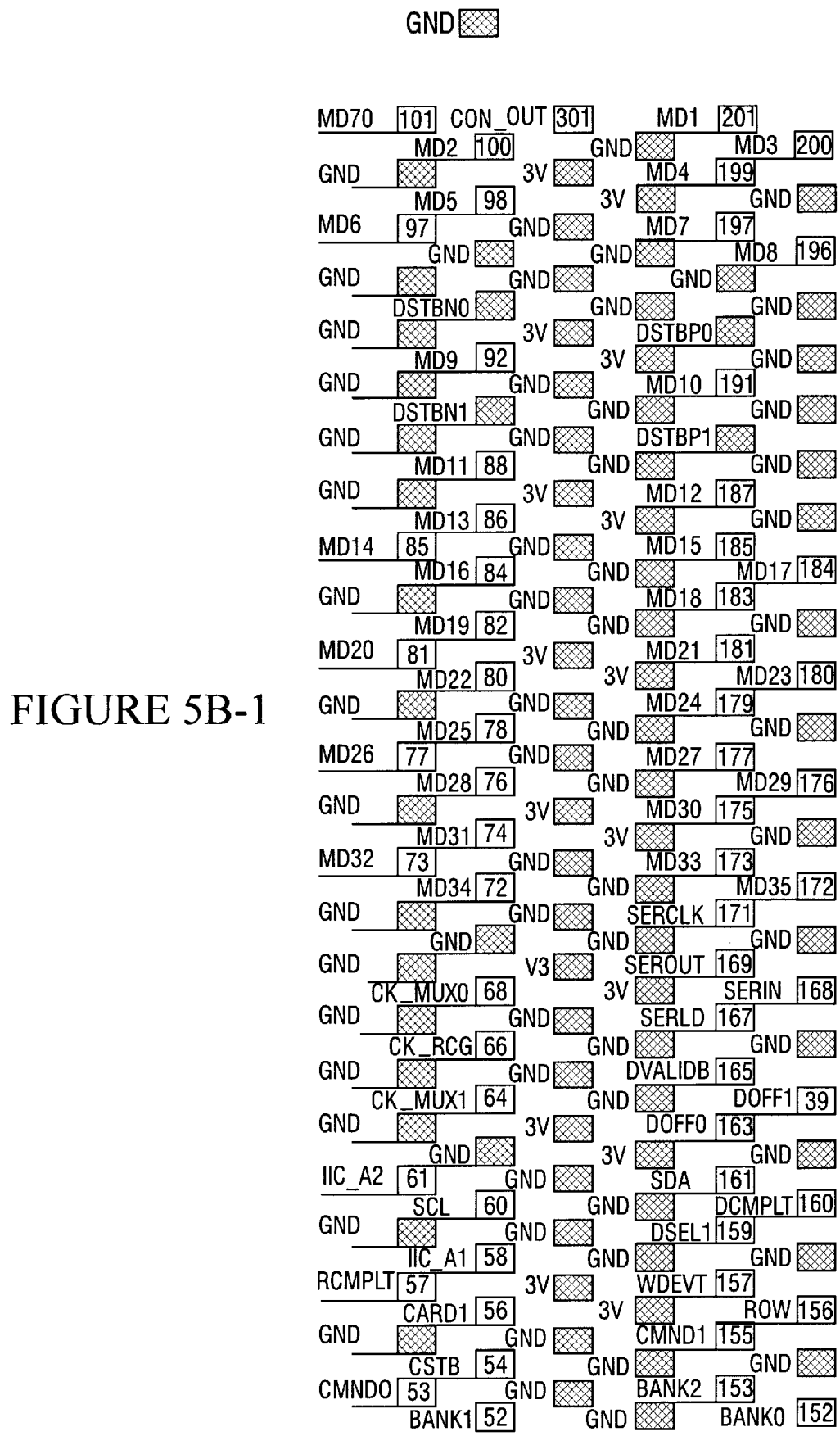
Figures 2, 5B:
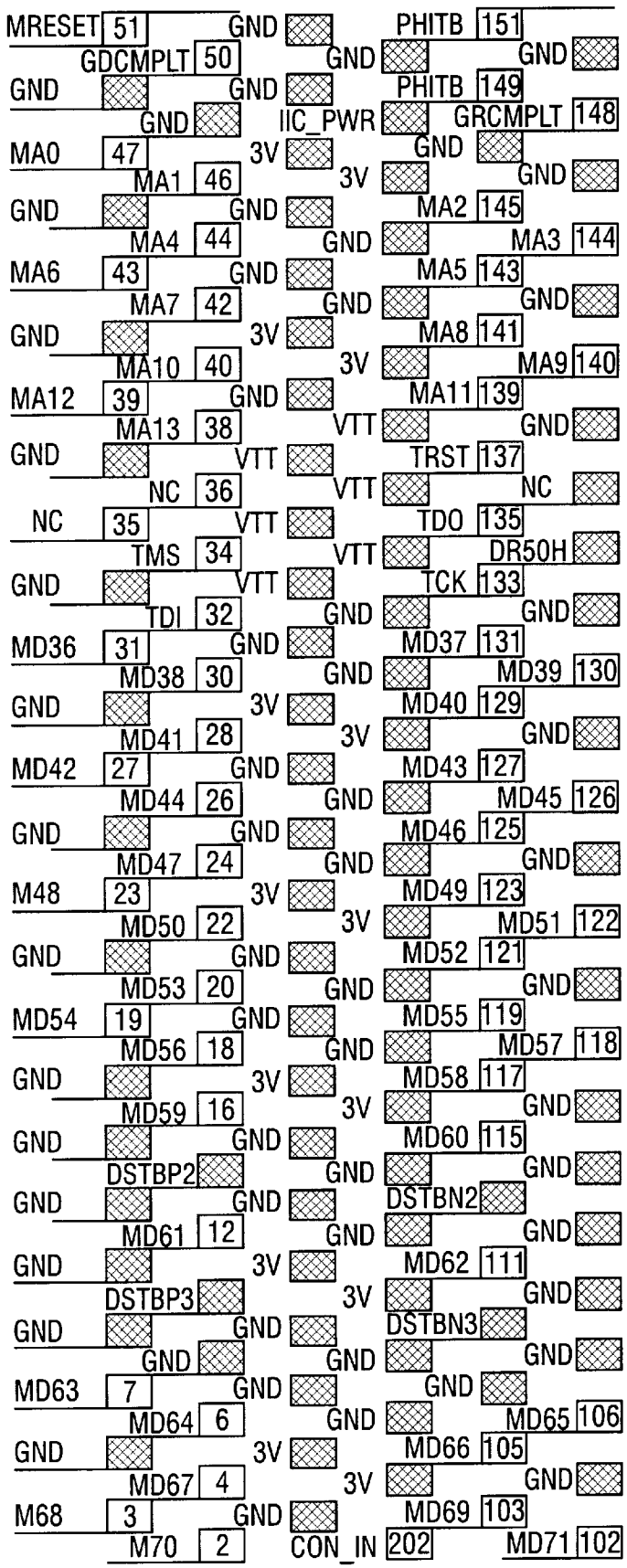

FIG. 4 illustrates an alternative embodiment of an electrical schematic of connections between the memory cards 22, 24. In the illustrated embodiment, the data written into the reverse connected memory card 24 is reordered so as to be the inverse of the data stored in the normally connected memory card 22. That is, the data stored in the memory card 24 is stored in the format D71–D0, whereas the data stored in the memory card 22 is stored in the format D0–D71. This inverse ordering is not necessary to proper operation, but is convenient from the standpoint of understanding the invention.

As discussed above, the cards 22, 24 are substantially identical, but installed backwards relative to each other. Since the data lines D0–D71 are symmetric, reversing the orientation of the card 24 reverses its connections to the data lines. That is, data connections D0–D71 are connected to data lines D71–D0, respectively.

The data lines D0–D71 are split into two halves D0–D31 and D32–D71 and delivered to a pair of multiplexers 100, 102. The multiplexers 100, 102 also receive data strobe signals (DSTBN0, DSTBP0; DSTBN1, DSTBP1; DSTBN2, DSTBP2; DSTBN3, DSTBP3) from a conventional memory controller (not shown) to control the delivery of data to the DIMMs 26. The data strobe signals are cross-coupled to the multiplexers 100, 102 of the reverse connected card 24 so that they are coupled to the multiplexer 100, 102 receiving the data with which they are associated. That is, the multiplexer 100 on the reverse connected memory card 24 receives the data bits D0–D35 and data strobe signals DSTBN0, DSTBP0; DSTBN1, DSTBP1. Likewise, the multiplexer 102 on the normally connected memory card 22 also receives the data bits D0–D35 and data strobe signals DSTBN0, DSTBP0; DSTBN1, DSTBP1. Thus, the data bits D0–D35 are controlled by the proper strobe bits on each memory card 22, 24, independent of the bits being stored in reverse order in the reverse connected memory card 24.

The multiplexer 102 on the reverse connected memory card 24 receives the data bits D36–D71 and data strobe signals DSTBN2, DSTBP2; DSTBN3, DSTBP3. Likewise, the multiplexer 100 on the normally connected memory card 22 also receives the data bits D36–D71 and data strobe signals DSTBN2, DSTBP2; DSTBN3, DSTBP3. Thus, the data bits D36–D71 are controlled by the proper strobe bits on each memory card 22, 24, independent of the bits being stored in reverse order in the reverse connected memory card 24.

FIG. 5 illustrates one embodiment of pin assignments of edge connectors 60, 61 in a system that has 302 total connections, including 72 data connections (MD0–MD71) and 14 address connections (MA0–MA13). That is, the pin assignments identified in FIG. 5 are designed to work with the system shown and described in conjunction with FIG. 4.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A memory storage system, comprising:

a motherboard having first and second electrical connectors;

a first memory card having a plurality of electrical connections coupled to the first electrical connector on said motherboard, said first memory card being adapted to receive a plurality of data signals over said first electrical connector and store said data signals in a first preselected pattern; and a second memory card having a plurality of electrical connections coupled to the second electrical connector on said motherboard, said second memory card being adapted to receive a plurality of data signals over said second electrical connector and store said data signals in a second preselected pattern, different from said first preselected pattern.

2. The memory storage system, as set forth in claim 1, wherein said first electrical connector has electrical connections adapted to receive a plurality of address signals, said first electrical connector receiving said plurality of address signals in a third preselected pattern, and said second electrical connector has electrical connections adapted to receive the plurality of address signals, said second electrical connector receiving said plurality of address signals in a fourth preselected pattern, different from said third preselected pattern.

3. The memory storage system, as set forth in claim 2, wherein the third and fourth preselected patterns are reversed.

4. The memory storage system, as set forth in claim 2, wherein said first and second electrical connectors are adapted to receive said address signals in a symmetric pattern.

5. The memory storage system, as set forth in claim 1, wherein the first and second preselected patterns are reversed.

6. The memory storage system, as set forth in claim 1, wherein said first and second electrical connectors are adapted to receive said data signals in a symmetric pattern.

7. A memory storage system, comprising:

a motherboard having first and second like electrical connectors, said first and second electrical connectors having a plurality of electrical connections adapted to receive data signals thereon, said electrical connections being symmetrically disposed;

a first memory card having a plurality of electrical connections coupled to the first electrical connector on said motherboard in a first orientation, said first memory card adapted to receive the data signals over said first electrical connector and store said data signals in a first preselected pattern; and a second memory card having a plurality of electrical connections coupled to the second electrical connector on said motherboard in a second orientation, said second memory card receiving a plurality of data signals over said second electrical connector and storing said data signals in a second preselected pattern.

8. The memory storage system, as set forth in claim 7, wherein said first electrical connector has electrical connections adapted to receive a plurality of address signals, said first electrical connector receiving said plurality of address signals in a third preselected pattern, and said second electrical connector has electrical connections adapted to receive the plurality of address signals, said second electrical connector receiving said plurality of address signals in a fourth preselected pattern, different from said third preselected pattern.

9. The memory storage system, as set forth in claim 8, wherein the third and fourth preselected patterns are reversed.

10. The memory storage system, as set forth in claim 8, wherein said first and second electrical connectors are adapted to receive said address signals in a symmetric pattern.

11. The memory storage system, as set forth in claim 7, wherein the first and second preselected patterns are reversed.

12. A motherboard, comprising:

a first plurality of electrical traces adapted to receive data signals thereon;

a second plurality of electrical traces adapted to receive address signals thereon;

a first electrical connector coupled to said first and second plurality of traces in a symmetric pattern and being adapted to receive a memory board in a first orientation; and a second electrical connector coupled to said first and second plurality of traces in the symmetric pattern and being adapted to receive a memory board in a second orientation, said second plurality of traces being coupled to said second electrical connector in reverse order.

* * * * *